(12) United States Patent
Yang et al.

(10) Patent No.: US 7,510,963 B2
(45) Date of Patent: Mar. 31, 2009

(54) SEMICONDUCTOR DEVICE HAVING MULTILAYER INTERCONNECTION STRUCTURE AND MANUFACTURING METHOD THEREOF

(75) Inventors: Won-suk Yang, Yongin (KR); Ki-nam Kim, Anyang (KR); Hong-sik Jeong, Suwon (KR)

(73) Assignee: Samsung Electronics Co., Ltd. (KR)

( * ) Notice: Subject to any disclaimer, the term of this patent is extended or adjusted under 35 U.S.C. 154(b) by 52 days.

(21) Appl. No.: 10/989,930

(22) Filed: Nov. 16, 2004

(65) Prior Publication Data

US 2005/0070094 A1 Mar. 31, 2005

Related U.S. Application Data

(62) Division of application No. 09/999,104, filed on Oct. 31, 2001, now Pat. No. 6,836,019.

(30) Foreign Application Priority Data

Feb. 8, 2001 (KR) ................................. 01-6123

(51) Int. Cl.
*H01L 21/4763* (2006.01)
(52) U.S. Cl. .................... 438/637; 438/672; 438/253; 438/393
(58) Field of Classification Search .............. 438/637, 438/620, 672
See application file for complete search history.

(56) References Cited

U.S. PATENT DOCUMENTS

| 5,674,781 A | * | 10/1997 | Huang et al. ................ 438/629 |
| 5,834,845 A | | 11/1998 | Stolmeijer ................... 257/752 |
| 5,840,624 A | | 11/1998 | Jang et al. ................... 438/624 |
| 5,891,799 A | | 4/1999 | Tsui ............................ 438/624 |
| 5,998,251 A | * | 12/1999 | Wu et al. ..................... 438/241 |
| 6,001,683 A | * | 12/1999 | Lee ............................ 438/241 |
| 6,037,216 A | * | 3/2000 | Liu et al. .................... 438/253 |
| 6,081,032 A | | 6/2000 | Wu ............................. 257/752 |
| 6,150,721 A | | 11/2000 | Bandyopadhyay et al. .. 257/758 |
| 6,165,898 A | * | 12/2000 | Jang et al. ................... 438/638 |

(Continued)

FOREIGN PATENT DOCUMENTS

JP 8-298285 11/1996

*Primary Examiner*—Steven Loke
*Assistant Examiner*—David Goodwin
(74) *Attorney, Agent, or Firm*—Mills & Onello, LLP

(57) ABSTRACT

A semiconductor device and manufacturing method thereof include a semiconductor substrate, an interlevel dielectric (ILD) layer formed on the semiconductor substrate, a first contact stud formed in the ILD layer, having a width of an entrance portion adjacent to the surface of the ILD layer larger than the width of a contacting portion adjacent to the semiconductor substrate, and a second contact stud spaced apart from the first contact stud and formed in the ILD layer. The semiconductor device further includes a landing pad formed on the ILD layer to contact the surface of the second contact stud, having a width larger than that of the second contact stud. The second contact stud has a width of a contacting portion that is the same as that of an entrance portion. Also, at least one spacer comprising an etch stopper material is formed on the sidewalls of the landing pad and the etch stopper is formed on the landing pad. The entrance portion of the first contact stud has a width about 30-60% larger than that of the contacting portion.

11 Claims, 10 Drawing Sheets

U.S. PATENT DOCUMENTS

| | | | |
|---|---|---|---|
| 6,197,639 B1 * | 3/2001 | Lee et al. | 438/258 |
| 6,261,937 B1 * | 7/2001 | Tobben et al. | 438/601 |
| 6,281,059 B1 * | 8/2001 | Cheng et al. | 438/200 |
| 6,324,095 B1 | 11/2001 | McPartland et al. | 365/185.05 |
| 6,353,269 B1 | 3/2002 | Huang | 257/906 |
| 6,476,488 B1 * | 11/2002 | Jeng et al. | 257/751 |
| 6,528,845 B1 | 3/2003 | Bude et al. | 257/324 |
| 6,548,394 B1 * | 4/2003 | Peng et al. | 438/618 |
| 6,573,170 B2 | 6/2003 | Aoyagi et al. | 438/612 |
| 7,030,029 B2 * | 4/2006 | Tsuchiya | 438/714 |
| 2002/0173152 A1 * | 11/2002 | Chen et al. | 438/691 |

* cited by examiner

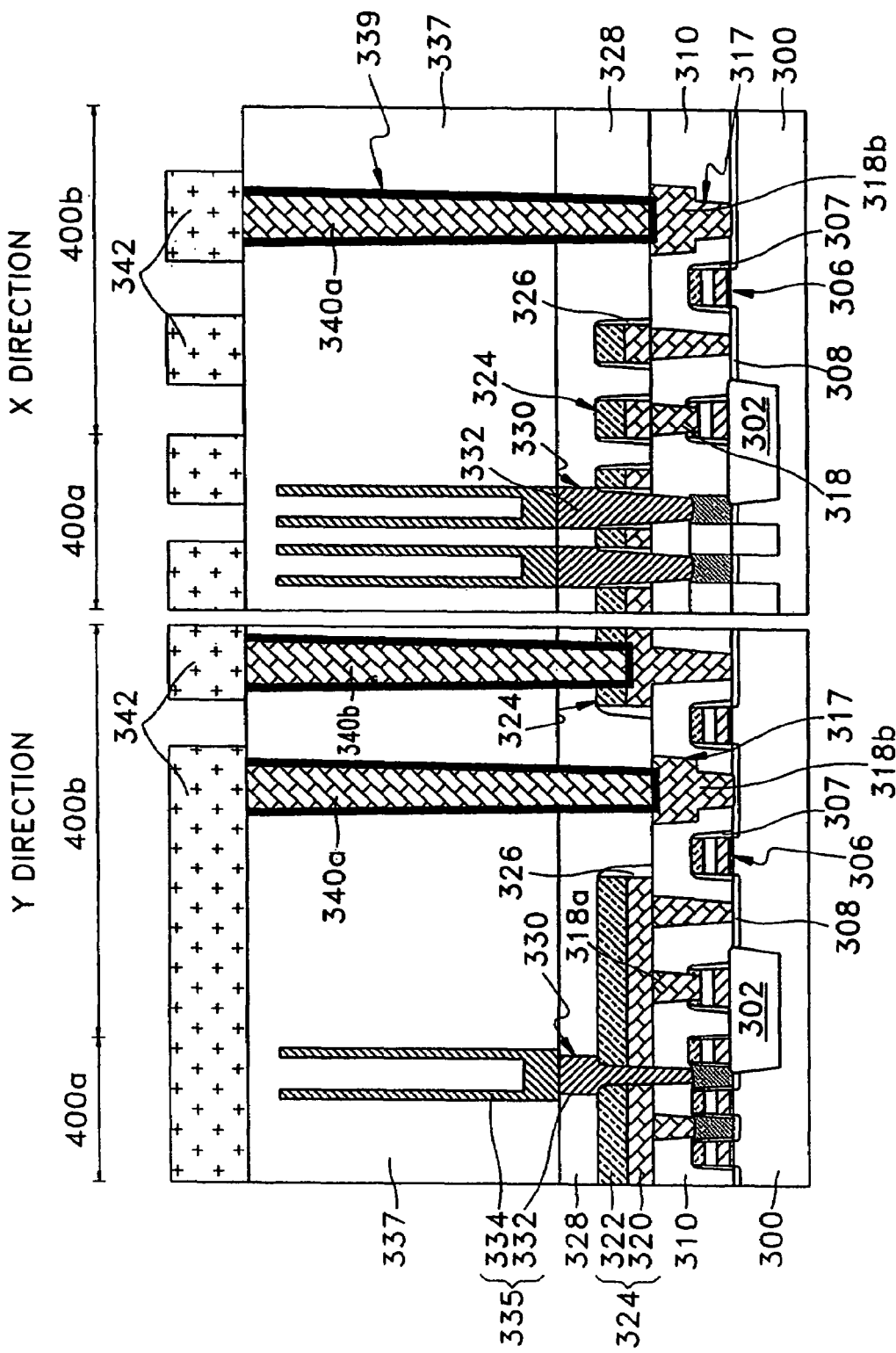

SEMICONDUCTOR DEVICE HAVING MULTILAYER INTERCONNECTION STRUCTURE AND MANUFACTURING METHOD THEREOF

RELATED APPLICATIONS

This application is a divisional of U.S. application Ser. No. 09/999,104, filed Oct. 31, 2001 now U.S. Pat. No. 6,836,019, which relies for priority upon Korean patent application number 01-6123, filed Feb. 8, 2001, the contents of which are herein incorporated by reference in their entirety.

BACKGROUND OF THE INVENTION

1. Field of the Invention

The present invention relates to a semiconductor device and manufacturing method thereof, and more particularly, to a semiconductor device having a multilayer interconnection structure and manufacturing method thereof.

2. Description of the Related Art

In general, multilayered interconnection technology employs three-dimensional integrated circuits to more effectively utilize the surface area of the integrated circuits. Highly integrated memory devices having a large capacity equal to or greater than 1 gigabyte, for example, a dynamic random access memory (DRAM) device, can be designed by employing the multilayered interconnection technology.

In multilayer interconnections, active devices and interconnections have a structure in which layers are stacked, and each layer is connected by an interlevel, or interlayer, connection path such as a "plug" or "stud". Also, a "landing pad" or "tab" for assisting the alignment of the plug is formed on an underlying layer to serve as a target for a plug. Further, the landing pad is connected to an underlying circuit or interconnection, and its surface area is formed to be larger than that of the underlying circuit or interconnection. This results in a larger tolerance of the target for the plug. However, a conventional landing pad or tap assists the alignment of the plug, and due to the width being larger than that of the stud (or plug), there is a high risk that a short-circuit may occur between neighboring circuit patterns. Thus, at present, instead of using the landing pad, a technology in which self-aligned metal interconnections are formed by an etch stopper has been suggested.

FIG. 1 is a sectional view of a conventional multilayer metal interconnection structure including a stud and an etch stopper, as disclosed in U.S. Pat. No. 5,891,799. Referring first to FIG. 1, a metal interconnection 102 is formed on a semiconductor substrate 100. A first interlevel dielectric (ILD) layer 104 composed of silicon dioxide ($SiO_2$) and a first etch stopper 106 composed of silicon nitride ($Si_3N_4$) are sequentially formed on the semiconductor substrate 100 on which the metal interconnection 102 is formed. Next, lower stud holes 108a and 108b are formed by patterning the first etch stopper 106 and the first ILD layer 104 to expose the metal interconnection 102 and the semiconductor substrate 100. Next, the lower stud holes 108a and 108b are filled with a metal material to form lower studs 110a and 110b. A second ILD layer 112 and a second etch stopper 114 are sequentially formed on the resultant of the semiconductor substrate 100 on which the lower studs 110a and 110b are formed. Next, upper stud holes 116a and 116b are formed by etching the second etch stopper 114 and the second ILD layer 112 to expose the lower studs 110a and 110b. Here, during an etching process for forming the upper stud holes 116a and 116b, the first etch stopper 106 serves as an etching reference. Next, upper studs 118a and 118b are formed in the upper stud holes 116a and 116b.

However, the following problems arise in a conventional multilayer interconnection structure. First, in the mentioned prior art, a landing pad is not used. Thus, even though the first etch stopper 106 is used, there is a high risk that misalignment between the lower studs 110a, 110b and the upper studs 118a, 118b may occur. Meanwhile, when the landing pad is used, as described above, the distance between patterns decreases. Thus, a short-circuit can readily occur between neighboring conductive patterns.

Furthermore, a bit line of the DRAM is often used as a local interconnection on a peripheral region on which a sense amplifier is formed. In particular, since circuit layers are very densely arranged on the peripheral region, it is not easy to secure a safe distance between patterns in the horizontal direction that are formed on the same level.

Also, since the first and second etch stoppers 106 and 114 composed of silicon nitride ($Si_3N_4$) are formed on the entire resultant of the semiconductor substrate 100, excessive stress causing circuit distortion occurs in the ILD layers. Furthermore, the first and second etch stoppers 106 and 114 prevent impurities such as carbon (C), fluorine (F), and chlorine (Cl), which are contained in the ILD layers, from being outgassed during a subsequent high temperature heating process. Also, the remaining etch stoppers 106 and 114 disturb the introduction of $H_2$ and $O_2$ during a thermal process for reducing dangling bonds between the semiconductor substrate 100 and a gate insulating layer (not shown). As a result, the adhesion characteristics between the semiconductor substrate 100 and the gate insulating layer are adversely affected.

SUMMARY OF THE INVENTION

To address the above limitations, it is a first objective of the present invention to provide a semiconductor device capable of preventing short-circuits between neighboring conductive patterns in highly integrated circuits.

It is a second objective of the present invention to provide a semiconductor device capable of obtaining a sufficient contact margin between upper and lower studs.

It is a third objective of the present invention to provide a semiconductor device capable of preventing short-circuits between neighboring conductive patterns while obtaining a sufficient contact margin between upper and lower studs.

It is a fourth objective of the present invention to provide a semiconductor device capable of reducing stress of an interlevel dielectric (ILD) layer, caused by an etch stopper.

It is a fifth objective of the present invention to provide a semiconductor device capable of adequate outgassing of impurities while reducing stress in circuits.

It is a sixth objective of the present invention to provide a semiconductor device capable of preventing deterioration of the adhesion characteristics of a gate insulating layer and a semiconductor substrate.

It is a seventh objective of the present invention to provide a method for manufacturing the semiconductor device.

Accordingly, to achieve the first through sixth objectives, according to an aspect of the present invention, there is provided a semiconductor device. An interlevel dielectric (ILD) layer is formed on the semiconductor substrate. A first contact stud is formed in the ILD layer having a width at an entrance portion adjacent the surface of the ILD layer larger than the width of a contacting portion adjacent the semiconductor substrate. A second contact stud spaced apart from the first contact stud is formed in the ILD layer. It is preferable that the entrance part of the first contact stud has a width about 30-60% larger than that of the contacting part.

Accordingly, to achieve the first through sixth objectives, according to another aspect of the present invention, there is provided a semiconductor device. An interlevel dielectric (ILD) layer is formed on the semiconductor substrate. A first contact stud having a width of an entrance part adjacent to the surface of the ILD layer larger than the width of a contacting part adjacent to the semiconductor substrate is formed in the ILD layer. A second contact stud spaced apart from the first contact stud is formed in the ILD layer. A landing pad having a width larger than that of the second contact stud is formed on the ILD layer to contact the surface of the second contact stud.

It is preferable that the second contact stud has the width of a contacting part that is entirely the same as that of an entrance part, and the entrance part of the first contact stud has a width about 30-60% larger than that of the contacting part.

Accordingly, to achieve the first through sixth objectives, according to still another aspect of the present invention, there is provided a semiconductor device. An interlevel dielectric (ILD) layer is formed on the semiconductor substrate. A first contact stud having a width of an entrance part adjacent to the surface of the ILD layer larger than the width of a contacting part adjacent to the semiconductor substrate is formed in the ILD layer. A second contact stud spaced apart from the first contact stud is formed in the ILD layer. A landing pad having a width larger than that of the second contact stud is formed on the ILD layer to contact the surface of the second contact stud. An etch stopper covers only the top and side of the landing pad.

It is preferable that the second contact stud has a width of a contacting part that is entirely the same as that of an entrance part, and the etch stopper includes a first etch stopper formed on the landing pad and a second etch stopper formed of a spacer on both sidewalls of the landing pad, and the entrance part of the first contact stud has a width about 30-60% larger than that of the contacting part.

It is also preferable that a plurality of gate electrodes are arranged adjacent to each other between the semiconductor substrate and the ILD layer, and self-aligned plugs are formed between the gate electrodes, and a third contact stud contacting the self-aligned plugs formed in the ILD layer. Here, it is preferable that the depth of the entrance part of the first contact stud is equal to or slightly greater than that of the third contact stud.

The semiconductor substrate is defined by a cell region and a peripheral region, the third contact stud is formed on the cell region, and the first contact stud is formed on the peripheral region.

Accordingly, to achieve the seventh objective, there is provided a method for manufacturing a semiconductor device. An interlevel dielectric (ILD) layer is formed on a semiconductor substrate. Next, a first stud hole having a width of an entrance part adjacent to the surface of the ILD layer larger than the width of a contacting part adjacent to the semiconductor substrate is formed in the ILD layer. Subsequently, a second stud hole to be spaced apart from the first stud hole is formed in the ILD layer. Next, first and second contact studs are formed by filling the first stud hole and the second stud hole with a conductive material.

Here, a first stud hole and a second stud hole can be formed by the following method. First, a plurality of first holes for etching a portion of the ILD layer to a shallower depth than that of the ILD layer are formed. Subsequently, a plurality of second holes are formed by etching part of the ILD layer positioned under the first hole selected from the plurality of first holes and a portion of the ILD layer on which the plurality of first holes are not formed and exposing the semiconductor substrate.

It is preferable that a photoresist pattern is formed on the ILD layer on which the plurality of first holes are formed, while covering internal sidewalls of the selected first hole, which exposes other portions of the ILD layer. Next, the ILD layer is etched to have the shape of the photoresist pattern. Before forming the ILD layer on the semiconductor substrate, gate electrodes are formed on the semiconductor substrate, and self-aligned contact plugs are formed between the gate electrodes. Here, portions selected from self-aligned contact plugs are exposed simultaneously with forming a plurality of first holes. Also, the first holes are formed to a depth equal to or deeper than the distance from the surface of the ILD layer to the surface of the contact plugs.

Also, a first stud hole and a second stud hole can be formed by the following method. A plurality of first holes for etching a portion of the ILD layer and exposing a selection region of the semiconductor substrate are formed. Next, a plurality of second holes having widths larger than those of the first holes are formed by etching the ILD layer formed on sides of the first holes selected from the plurality of first holes to a predetermined depth. Here, before forming the IDL layer on the semiconductor substrate, gate electrodes are formed on the semiconductor substrate, and self-aligned contact plugs are formed between the gate electrodes. Here, portions selected from self-aligned contact plugs are exposed simultaneously with forming a plurality of second holes. Also, the second holes are formed to a depth equal to or deeper than the distance from the surface of the ILD layer to the surface of the contact plugs:

Also, after the step of forming first and second contact studs, a conductive landing pad having a width larger than that of the second contact stud is formed on the ILD layer to contact the second contact stud. After forming a conductive landing pad, an etch stopper is formed to cover the conductive landing pad. Here, the etch stopper is formed by the following method. That is, a first etch stopper is formed on the conductive landing pad, and a second etch stopper formed of a spacer is formed on both sidewalls of the landing pad and the first etch stopper.

BRIEF DESCRIPTION OF THE DRAWINGS

The above objectives and advantages of the present invention will become more apparent by describing in detail preferred embodiments thereof with reference to the attached drawings in which:

FIGS. 3A through 3G are sectional views for each process of the multilayer interconnection structure of a memory device including a cell region and a peripheral region according to another embodiment of the present invention;

DETAILED DESCRIPTION OF PREFERRED EMBODIMENTS

Figure 1:
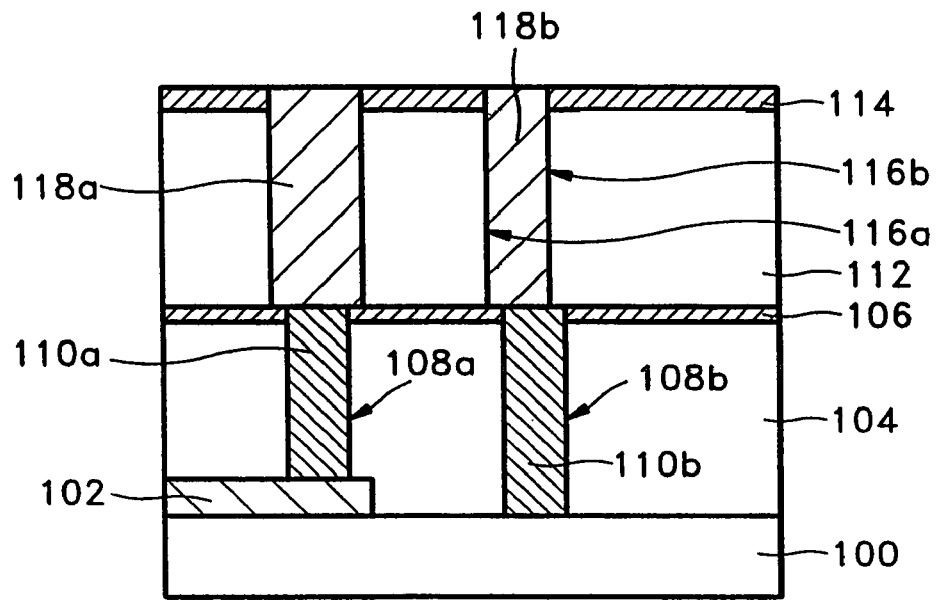
FIG. 1 is a sectional view of a conventional semiconductor device having a multilayer interconnection structure including an etch stopper.

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the forms of elements are exaggerated for clarity. Like reference numerals refer to like elements throughout the drawings. It will be understood that when a layer is referred to as being on another layer or "on" a semiconductor substrate, it can be directly on the other layer or on the semiconductor substrate, or intervening layers may also be present.

Embodiment 1

Figure 2:
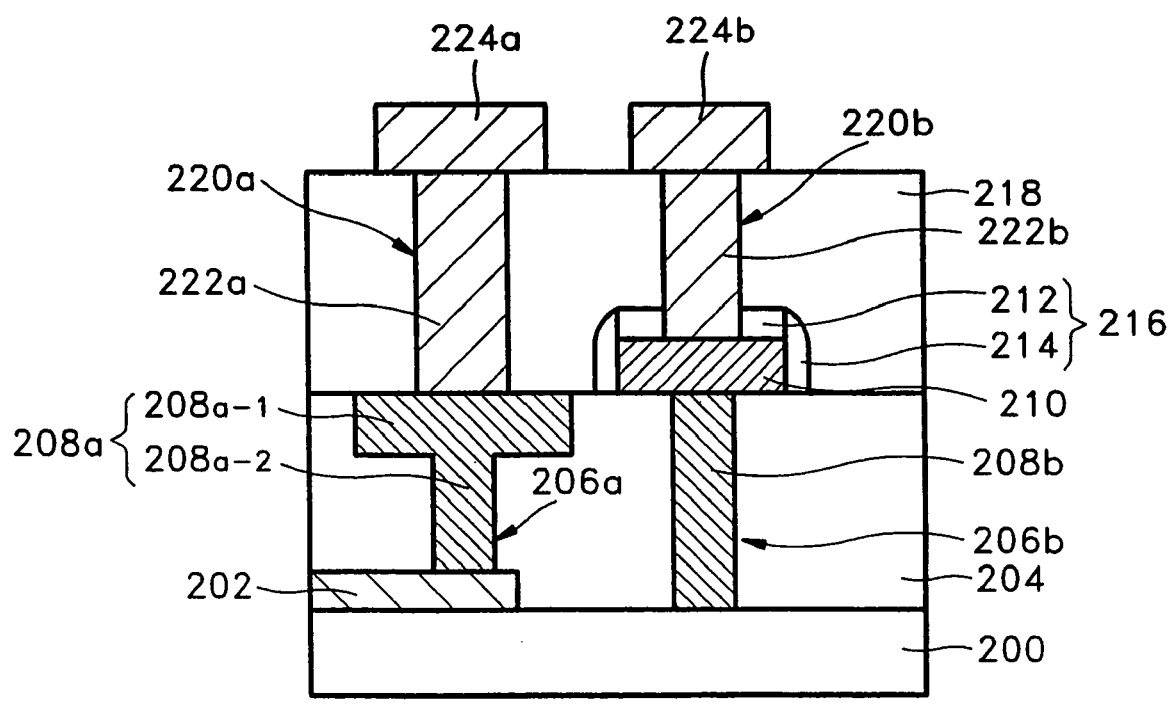
FIG. 2 is a sectional view of a semiconductor device having a multilayer interconnection structure according to an embodiment of the present invention.

FIG. 2 is a sectional view of a semiconductor device according to an embodiment of the present invention, and the principles of the present invention will be described with reference to FIG. 2. A conductive pattern 202 is initially formed on a semiconductor substrate 200, and a first interlevel dielectric (ILD) layer 204 is formed on the conductive pattern 202. Lower stud holes 206a and 206b are formed in the first ILD layer 204 to expose portions of the conductive pattern 202 and the semiconductor substrate 200, and the lower stud holes 206a and 206b are filled with a conductive material, thereby forming lower studs 208a and 208b. Here, one lower stud 208a of the lower studs 208a and 208b has the width of an upper portion (hereinafter, an entrance part 208a-1) adjacent to the surface of the first ILD layer 204 larger than the width of a lower portion (hereinafter, a contacting part 208a-2) adjacent to the semiconductor substrate 200. Preferably, the width of the upper, entrance part, 208a-1 is 30%, more preferably, 30-60% larger than that of the lower, contacting part 208a-2. The lower stud 208a can be formed to have, for example, a "T"-shaped cross-section. Here, the entrance part 208a-1 of the lower stud 208a is formed in the first ILD layer 204 and later serves as a landing pad during subsequent processes.

Meanwhile, the other lower stud 208b has the width of a contacting part that is entirely the same as that of the an entrance part. A landing pad 210 formed of a conductive layer is formed on the lower stud 208b. As well-known, the landing pad 210 has a width larger than that of the lower stud 208b.

An etch stopper 216 is formed on the surface and sidewalls of the landing pad 210. The etch stopper 216 includes a first etch stopper 212 formed on the surface of the landing pad 210 and a second etch stopper 214 formed of a spacer on both sidewalls of the landing pad 210.

A second ILD layer 218 is formed on the first ILD layer 204 on which the landing pad 210 is formed. Upper stud holes 220a and 220b are formed in the second ILD layer 218 to expose a portion of the lower stud 208a and the landing pad 210. Here, as the landing pad 210 is selectively formed, the height of the upper stud holes 220a and 220b are different. The upper stud holes 220a and 220b are filled with a conductive material, thereby forming upper studs 222a and 222b. Metal interconnections 224a and 224b are formed on the upper studs 222a and 222b, respectively, thereby completing a circuit.

Likewise, one lower stud 208a of the lower studs 208a and 208b forms the landing pad 210 in the first ILD layer 204, and the other lower stud 208b forms the landing pad 210 on the first ILD layer 204. As a result, a misalignment between the upper studs 222a and 222b is prevented, and simultaneously, insulation between neighboring patterns is achieved.

Further, the etch stopper 216 does not remain on the entire resultant of the semiconductor substrate 200 but, instead, is formed to only cover the landing pad 210. Thus, stress caused by the etch stopper 216 is reduced, and impurities are readily outgassed during subsequent processes.

Embodiment 2

Typical applications of the present invention will be realized based on the drawings of FIGS. 3A through 3G. Here, FIGS. 3A through 3G are sectional views for each process of the multilayered interconnection structure of a memory device including a cell region and a peripheral region according to another embodiment of the present invention. In the drawings, "X" directions denote, for example, bit line-extended directions, and "Y" directions denote, for example, word line-extended directions.

Figure 3A:
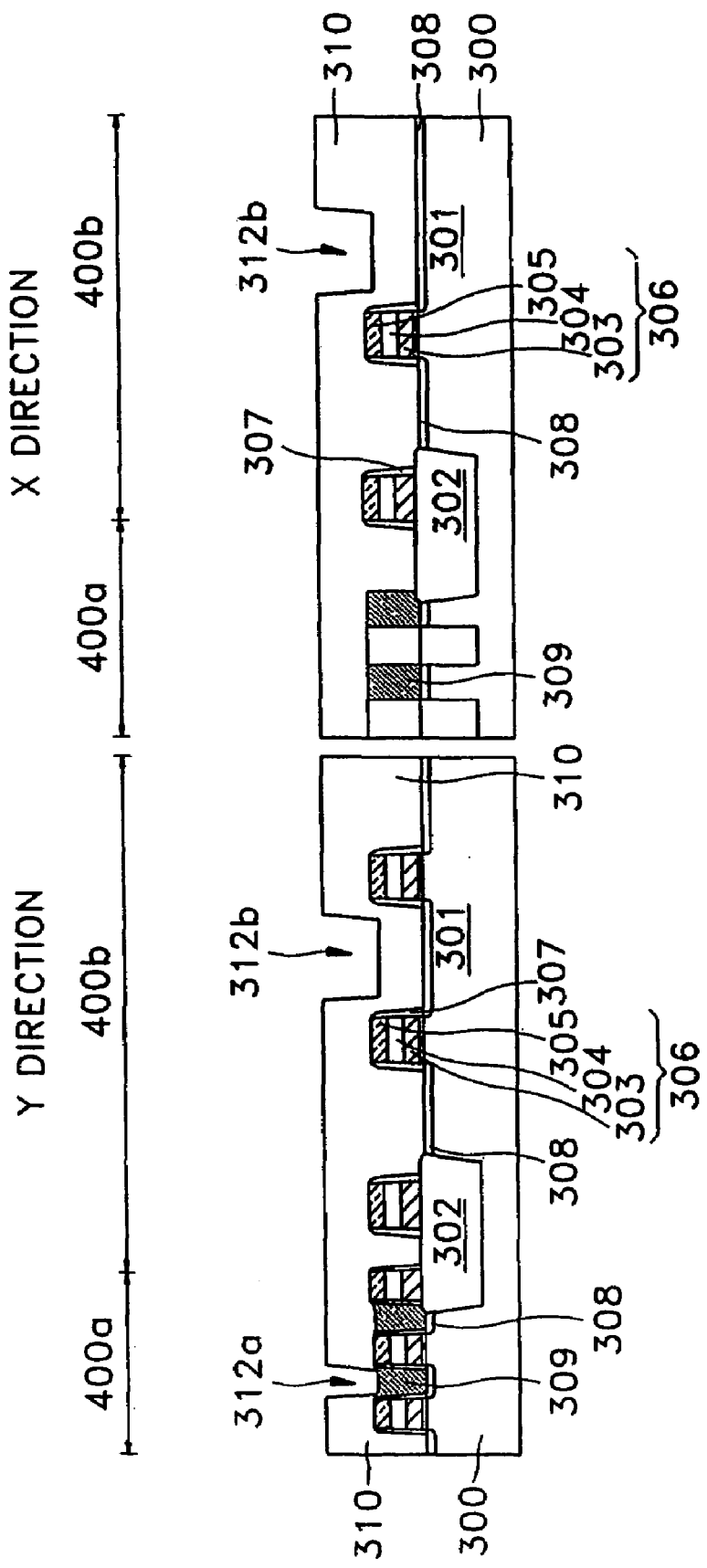

Referring to FIG. 3A, a semiconductor substrate 300 on which a memory device is to be formed, is provided. A device isolation layer 302 is formed on a portion of the semiconductor substrate 300, thereby defining an active region 301. Also, a cell region 400a on which memory cells and bit lines are formed, and a peripheral region 400b on which peripheral circuits for assisting a memory cell region, such as peripheral interconnections and input/output circuits, are formed, are defined by the device isolation layer 302. Gate electrodes 306, for example, word lines, are formed on the semiconductor substrate 300 on which the cell region 400a and the peripheral region 400b are defined. The gate electrodes 306 are formed of a structure in which a gate insulating layer 303, a gate conductive layer 304 for serving substantially as electrodes, and a capping insulating layer 305 for inducing self-aligned contacts are stacked. The gate electrodes 306 are very closely arranged on the cell region 400a and sparsely arranged on the peripheral region 400b. A sidewall spacer 307 formed of an insulating layer is formed on both sidewalls of the gate electrodes 306. A junction region 308 is formed by performing ion-implantation of impurities having the type opposite to that the semiconductor substrate 300 onto the semiconductor substrate 300 on both sides of the gate electrodes 306. Next, contact plugs 309 are formed between the gate electrodes 306 formed on the cell region 400a, and the contact plugs 309 contact the junction region 308. At this time, as well-known, the contact plugs 309 are formed by depositing a conductive layer and filling the conductive layer by an etch back method or a chemical mechanical polishing (CMP) method. Next, a first ILD layer 310 is formed on the resultant of the semiconductor substrate 300. The first ILD layer 310 can be formed of, for example, a high density plasma oxide layer.

Next, first stud holes 312a and 312b are formed by patterning a portion of the first ILD layer 310. Here, the first stud hole 312a formed on the cell region 400a is formed so that the selected contact plugs 309 may be exposed. The first stud hole 312b formed on the peripheral region 400b is formed to a predetermined depth of the first ILD layer 310, and the junction regions 308 are not exposed by the first stud hole 312b. Here, the peripheral region 400b on which the first stud hole 312b is formed, may be a region on which a sense amplifier in which circuits are closely arranged is formed. Here, the first stud hole 312b formed on the peripheral region 400b has a width larger than that of the first stud hole 312a formed on the cell region 400a. Preferably, the depth of the first stud hole 312b is equal to or slightly greater than that of the first stud hole 312a.

Figure 3B:
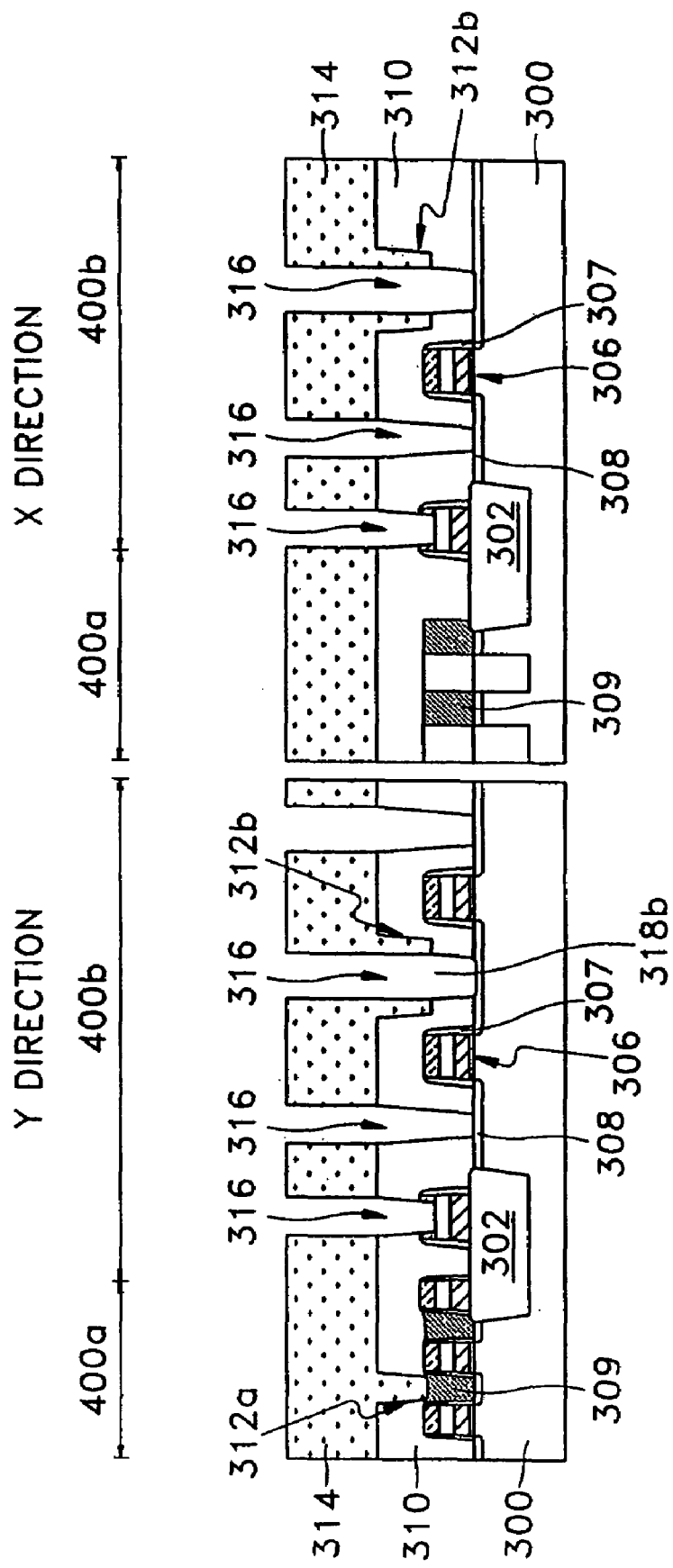

Referring to FIG. 3B, a photoresist pattern 314 is formed on the semiconductor substrate 300 on which the first stud holes 312a and 312b are formed, so as to define second stud holes. The photoresist pattern 314 is formed to remain even within the internal sidewalls of the first stud hole 312b formed in the peripheral region 400b. Next, the first ILD layer 310 is etched by using the photoresist pattern 314 as a mask, thereby forming second stud holes 316. The second stud holes 316 expose, for example, upper portions of the gate electrodes 306 of the peripheral region 400b, or the junction region 308. Further, one of the second stud holes 316 is formed in the first stud hole 312b by the photoresist pattern 314 formed in the first stud hole 312b. Here, preferably, the width of the first stud hole 312b coexisting with the second stud hole 316 is about 30%. More preferably, the width is 30-60% wider than that of the portion of the second stud hole 316 under the first stud hole 312b.

Figure 3C:
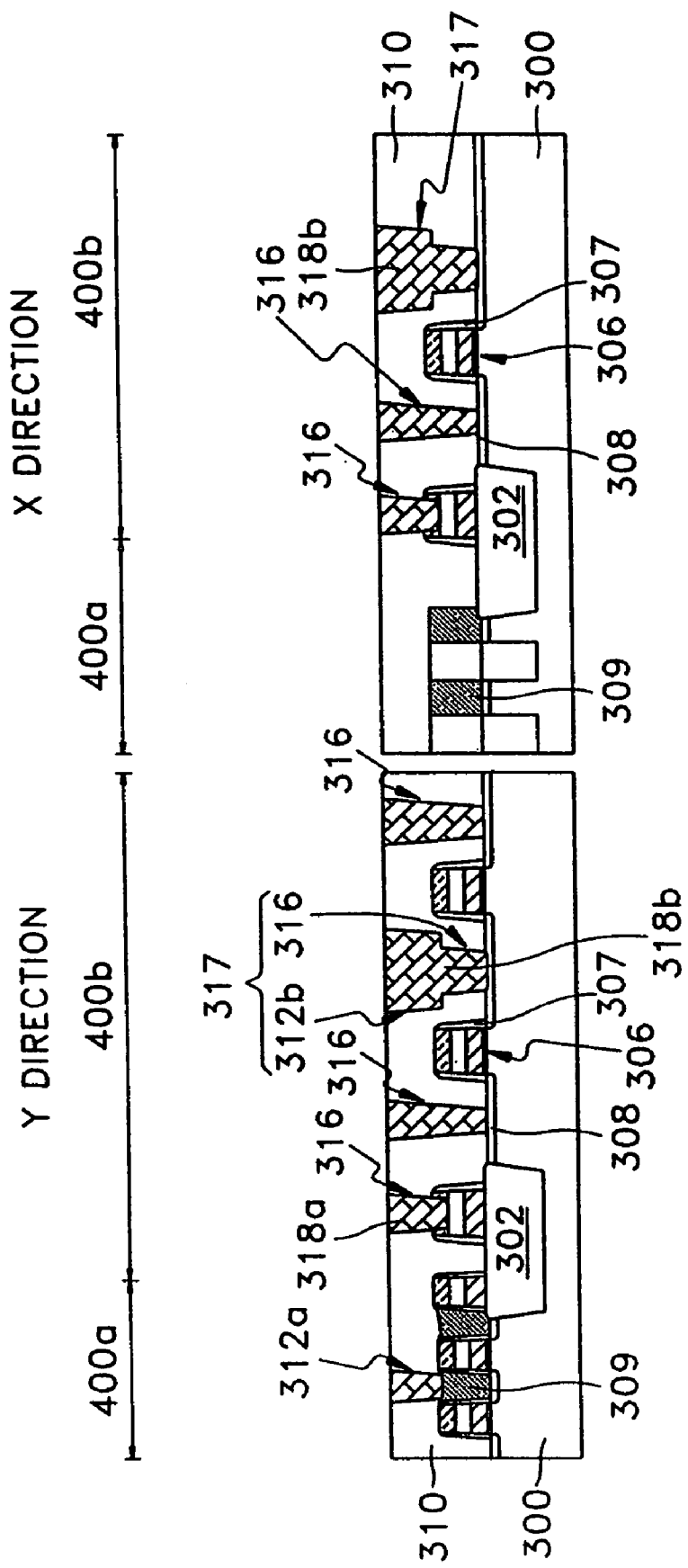

Next, as shown in FIG. 3C, the photoresist pattern 314 is removed. Here, a stud hole 317 of a stair-shaped cross-section where the first and second stud holes 312a and 316 coexist, has a wider entrance part and a narrower contacting part and is referred to as "stair-type stud hole" in this embodiment. Next, contact studs 318a and 318b are formed in the first stud hole 312a, the second stud hole 316, and the stair-type stud hole 317.

Here, the contact studs 318a and 318b are preferably formed by the following method. First, an adhesion layer (not shown) is formed on the internal surfaces of the first and second stud holes 312a, 312b, and 316 and the surface of the first ILD layer 310. Next, a conductive layer is deposited to fill the insides of the first and second stud holes 312a, 312b, and 316. Titanium (Ti), or a stacking layer of titanium (Ti) and titanium nitride (TiN) can be used as the adhesion layer. Here, in the case of using titanium (Ti), a titanium (Ti) layer is deposited to a thickness of about 50-150 Å by a chemical vapor deposition (CVD) method. In the case of using the stacking layer of titanium (Ti) and titanium nitride (TiN), a titanium nitride (TiN) layer is formed by one of the CVD method and an atomic layer deposition (ALD) method and has a thickness of about 250-350 Å. A conductive layer for the contact stud can be formed of, for example, tungsten metal, or titanium nitride (TiN). In the case of using tungsten metal, a tungsten metal layer is formed under a pressure 35-45 Torr and at the temperature of 410-420° C. and is expressed by Equation 1.

$$WF_6 + SiH_4 + H_2 \rightarrow W + SiF_4 + H_2 \quad \text{[Equation 1]}$$

Meanwhile, in the case of using titanium nitride (TiN), a titanium nitride (TiN) layer is deposited by the CVD method to a thickness of 1400-1600 Å. Next, the conductive layer and the adhesion layer are chemical mechanical polished until the surface of the first ILD layer 310 is exposed, thereby forming contact studs 318a and 318b, and simultaneously providing a planarized surface.

Here, the contact stud 318b formed in the stair-type stud hole 317 has a width of a top portion, or entrance part (corresponding to a first stud hole region), that is about 30% larger than the width of a lower portion, or contacting part (corresponding to a second stud hole region). Thus, when the entrance part contacts an upper level stud, the entrance part serves as a landing plug.

Figure 3D:
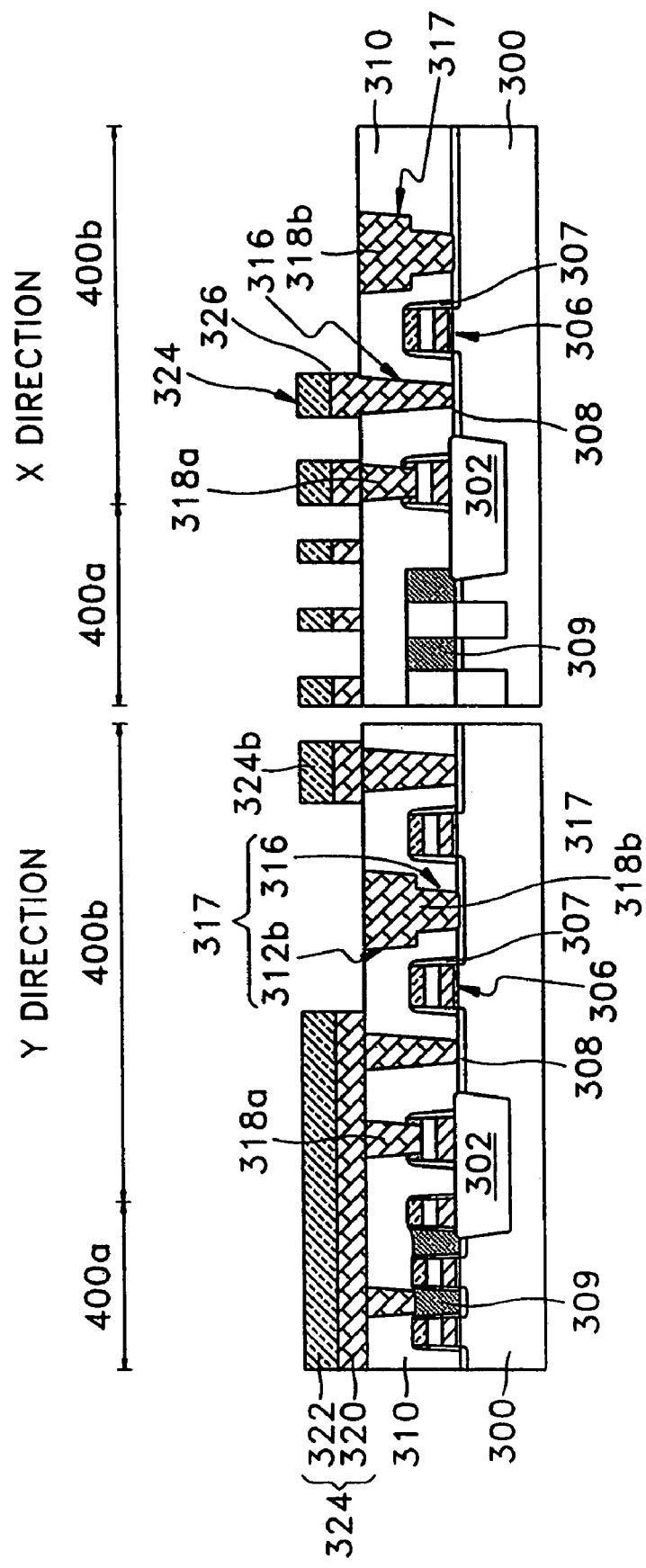

Next, as shown in FIG. 3D, a conductive layer 320 for a bit line and a bit line capping layer 322 are sequentially formed on the first ILD layer 310 on which the contact studs 318a and 318b are formed. Here, the conductive layer 320 for a bit line can be formed of, for example, tungsten, and the bit line capping layer 322 can be formed of one of silicon nitride ($Si_3N_4$), tantalum oxide ($Ta_2O_5$), or aluminum oxide ($Al_2O_3$). Here, the bit line capping layer 322 is used as an etch reference layer, that is, an etch stopper, when forming an upper level stud hole. Next, portions of the bit line capping layer 322 and the conductive layer 320 for a bit line are patterned, thereby forming a bit line 324. Here, the bit line 324 located on part of the cell region 400a and the peripheral region 400b can be used as a bit line 324 for transmitting data, and the bit line 324 located on the other part of the cell region 400a and the peripheral region 400b can be used as interconnections and a landing pad 324b. However, in this embodiment, a member including the bit line for transmitting data, the peripheral interconnections, and the landing pad 324b is referred to as a "bit line". Here, the bit line 324 does not contact the contact stud 318b formed in the stair-type stud hole 317.

Figure 3E:
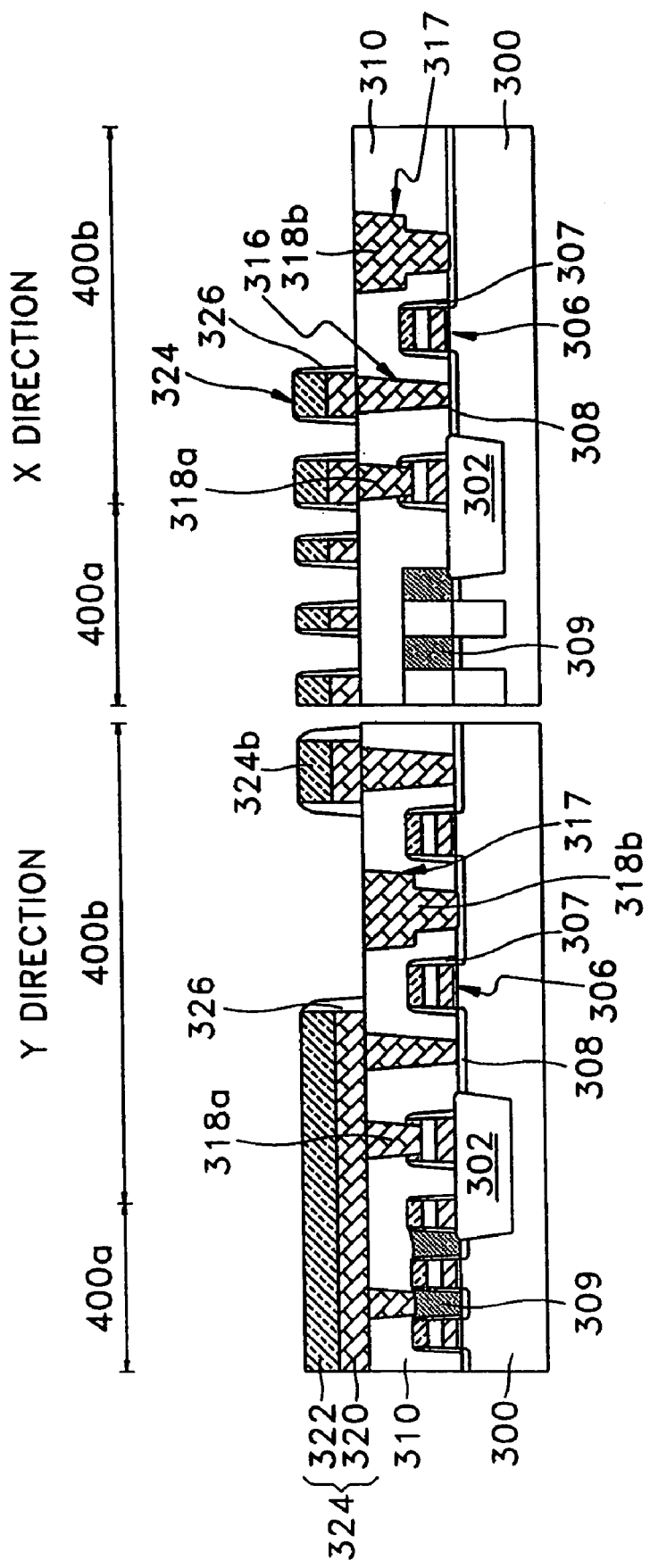

Referring to FIG. 3E, an insulating layer for a lateral spacer is deposited on the first ILD layer 310 having the bit line 324. The insulating layer for a spacer can be formed of, for example, silicon nitride ($Si_3N_4$), tantalum oxide ($Ta_2O_5$), or aluminum oxide ($Al_2O_3$), having an etching selectivity higher than that of conventional silicon oxide used as an ILD layer. Further, the insulating layer is deposited to a thickness of 200-700 Å, preferably, less than 500 Å. Next, the insulating layer is anisotropically etched, thereby forming a bit line spacer 326 on lateral sidewalls of interconnections, which are referred to as the bit line 324, on the first ILD layer. Here, the bit line spacer 326 is also used as an etch stopper when forming a stud hole.

Figure 3F:
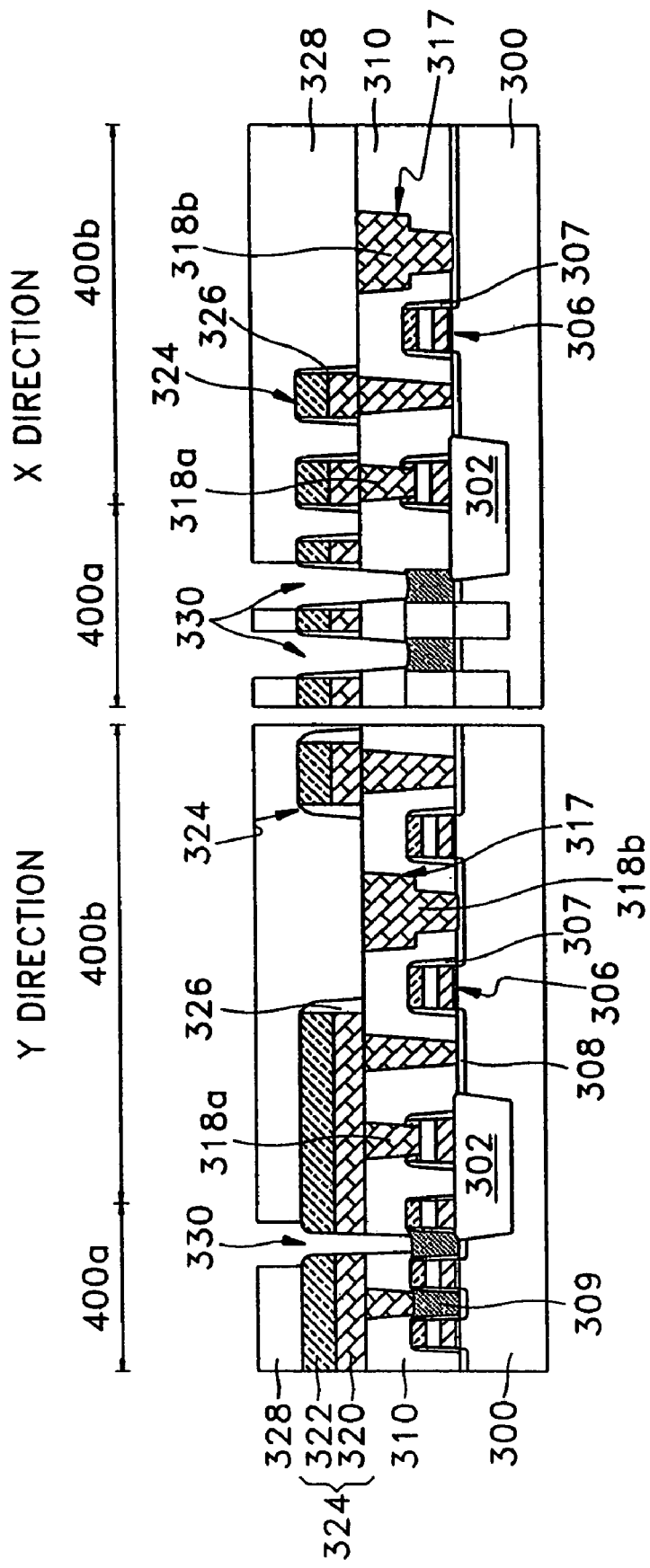

Next, as shown in FIG. 3F, a second ILD layer 328 is formed on the resultant of the semiconductor substrate 300. Here, the second ILD layer 328 has the planarized surface, and a planarized layer, or an insulating layer of which surface is chemical mechanical polished, can be used as the second ILD layer 328. Also, in general, the second ILD layer 328 has a silicon oxide component.

Next, the second ILD layer 328 and the first ILD layer 310 are sequentially etched to expose the selected contact plug 309 of the cell region 400a, thereby forming a storage node stud hole 330. The storage node stud hole 330 is self-aligned by the bit line spacer 326 and the bit line capping layer 322 on the bit line 324.

Next, as shown in FIG. 3G, a storage node contact 332 is formed to completely fill the inside of the storage node stud hole 330. Next, a cylinder-shaped electrode 334 is formed on the second ILD layer 328 to contact the storage node contact 332. As a result, a storage node electrode 335 is completed on the cell region 400a.

Next, a third ILD layer 337 is formed on the second ILD layer 328 on which the storage node electrode 335 is formed. The third ILD layer 337 also has the planarized surface and is formed to be thicker than the height of the storage node electrode 335 so as to completely fill the storage node electrode 335. Also, the third ILD layer 337 also has a silicon oxide component. A planarized layer, or an insulating layer of which the surface is chemical mechanical polished, can be also used as the third ILD layer 337.

Subsequently, portions of the third and second ILD layers 337 and 328 are etched so that the contact stud 318b filled in the stair-type stud hole 317 and the bit line 324b for serving as the landing pad may be exposed, thereby forming an upper level stud hole 339. When exposing the bit line 324, the third and second ILD layers 337 and 328 are etched so that the conductive layer of the bit line 324 is exposed. Further, the bit line capping layer 322 serves as an etch stopper for preventing an over-etch, that is, a guide for vertical direction during etching of the upper level stud hole 339. Also, the conductive layer 322 of the bit line 324 and the contact stud 318b are formed of metal having a very high etching selectivity between the third and second ILD layers 337 and 328, thus an over-etch does not occur when forming the upper level stud hole 339. The upper level stud hole 339 is formed in two steps of, that is, etching the third and second ILD layers 337 and 328, and etching the bit line capping layer 322. First, the step of etching the third and second ILD layers 337 and 328 is performed at about 1500 W power, under a pressure of 40 m Torr, and in the state of $C_4F_6+O_2+Ar$. Meanwhile, the step of etching the bit line capping layer 322 can be performed at about 600 W power, under a pressure of 50 m Torr, and in the state of $CHF_3+Ar+H_2$.

Next, upper level studs 340a and 340b are formed in the upper level stud hole 339. The upper level studs 340a and 340b can be formed by the same method as the mentioned contact studs 318a and 318b. Here, the upper level studs 340a and 340b contact the contact stud 318b in the stair-type stud hole 317 having a width larger than that of the upper level studs 340a and 340b, and the bit line 324 for serving as the landing pad, thus misalignment does not occur. Also, the contact stud 318b in the stair-type stud hole 317b has a width large enough to serve as the landing pad and is filled in the first ILD layer 310. The bit line 324 for serving as the landing pad is formed on the first ILD layer 310, thus insulation between two materials (the contact stud 318b and the bit line 324) can be sufficiently obtained (see Y-direction of FIG. 3G). That is, since the contact stud 318b and the bit line 324 are formed on different layers, the contact stud 318b and the bit line 324 do not contact neighboring conductive patterns even if the contact stud 318b and the bit line 314 are formed to a sufficient width considering the alignment margin regardless of the neighboring conductive patterns. Next, a metal interconnection 342 is formed on the third ILD layer 337 to contact the upper level studs 340a and 340b.

Embodiment 3

Figure 4A:
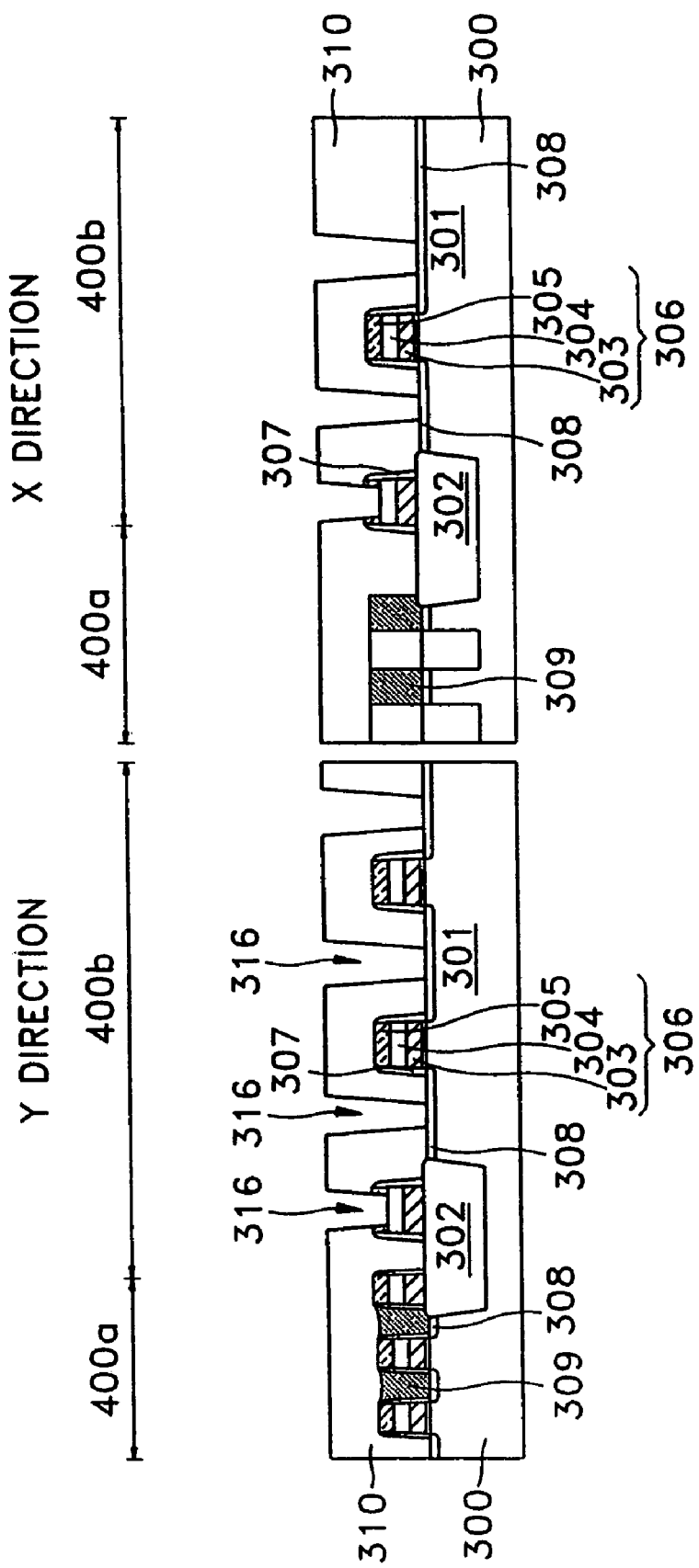
FIGS. 4A and 4B are sectional views for each process of the multilayer interconnection structure of the memory device including the cell region and the peripheral region according to another embodiment of the present invention.
Figure 4B:
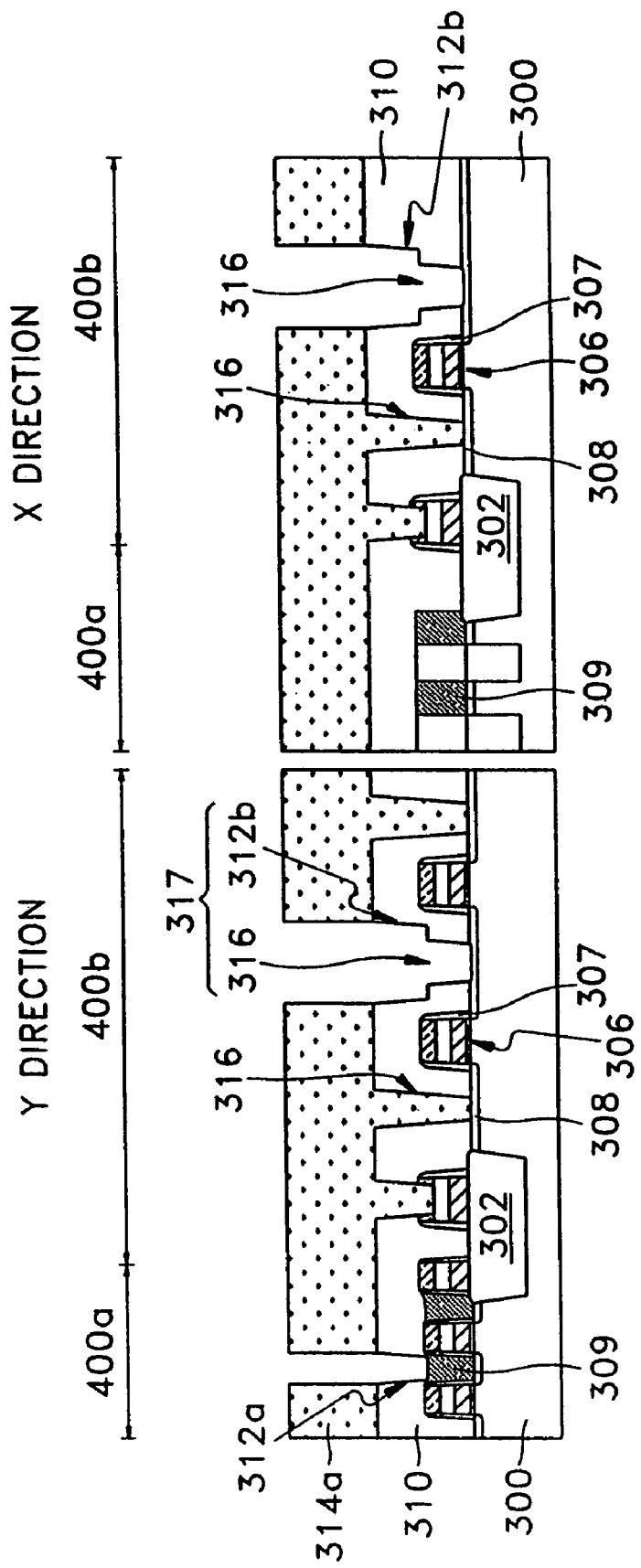

FIGS. 4A and 4B are sectional views for each process of the multilayer interconnection structure of the memory device including the cell region and the peripheral region according to another embodiment of the present invention. In this embodiment, since the steps of forming the gate electrodes 306, the junction region 308, the contact plug 309 on the semiconductor substrate 300 are the same as in the second embodiment, only the following steps will be described. Further, the same reference numerals are used in the same part of the embodiment as that of the second embodiment.

Referring to FIG. 4A, a first photoresist pattern (not shown) is formed on the first ILD layer 310 so that the selected gate electrodes 306 and the junction region 308 may be exposed. Here, a reticle (not shown) for forming the first photoresist pattern can be the same as that of the photoresist pattern 314 (see FIG. 3B). Next, the first ILD layer 310 is etched as the photoresist pattern, thereby forming the second stud holes 316 to be the same as those of the second stud holes 316 in the second embodiment. That is, in the embodiment, the second stud holes 316 (see FIG. 3B) in the second embodiment 2 are formed prior to the first stud holes 312a and 312b (see FIG. 3A). Next, the first photoresist pattern is removed.

Next, as shown in FIG. 4B, a second photoresist pattern 314a is formed so that the self-aligned contact plug 309 on the cell region 400a and one second stud hole 316 selected from the second stud holes 316 on the peripheral region 400b may be exposed. Here, the second photoresist pattern 314a is formed to expose part of the first ILD layer 310 on both sides of the second stud holes 316 when exposing the second stud holes 316 on the peripheral region 400b. Next, the first ILD layer 320 is etched by using the second photoresist pattern 314a as a mask, thereby forming the first stud holes 312a and 312b to be the same as in the first embodiment. Here, the first stud hole 312b formed on the peripheral region 400b has the width larger than that of the first stud hole 312a formed on the cell region 400a. Preferably, the depth of the first stud hole 312b is equal to or slightly greater than that of the first stud hole 312a. Next, the subsequent process is the same as that of the first embodiment.

Likewise, even if the step of forming the first stud holes 312a and 312b and the step of forming the second stud holes 316 are changed, the same effects can be obtained.

Also, the present invention is not construed as being limited to the mentioned embodiments. For example, in the embodiments of the present invention, when forming the second contact hole for the formation of the stair-type contact hole, the photoresist pattern was used as a mask. However, the present invention is not limited to this, all materials having a high etching selectivity with the first ILD layer can be used as a mask for forming the stair-type contact hole.

As described above, according to the present invention, the following effects can be obtained.

First, when forming the contact studs adjacently arranged in the ILD layer, one contact stud is formed of a stair-shaped cross-section having a wider upper entrance part and narrower lower contacting part. The other contact studs are formed in the ILD layers, of a pillar-shaped cross-section having a width at the entrance part that is entirely the same as that of the contacting part. The conductive pattern for a landing pad is formed on the ILD layer to have a size larger than the width of the contact stud so as to contact the contact stud. Here, since the entrance part of the stair-shaped contact stud and the conductive pattern for a landing pad are vertically arranged on the surface of the ILD layer, sufficient insulation can be obtained. Also, since they are not arranged on the same surface, they are not affected by the width in the horizontal direction. As a result, even if the landing pad is formed, a short-circuit between neighboring circuit patterns does not occur. Also, since the stair-shaped contact stud and the landing pad are used, a sufficient contact margin can be obtained when contacting the upper and lower studs.

Further, the etch stopper having a high etching selectivity with the ILD layer is formed on the surface and sidewalls of the conductive pattern for serving as the bit line, that is, the landing plug. As a result, the etch stopper is not formed on the entire semiconductor substrate but, rather is merely partially formed on the semiconductor substrate. Thus, stress caused by the etch stopper is reduced, and impurities in the ILD layer are easily outgassed. Additionally, as the etch stopper is partially formed, the effects of an alloying process can be doubled.

While this invention has been particularly shown and described with reference to preferred embodiments thereof, it will be understood by those skilled in the art that various changes in form and details may be made thereto without departing from the spirit and scope of the invention as defined by the appended claims.

What is claimed is:

1. A method for manufacturing a semiconductor device, the method comprising:
  forming a gate electrode on a semiconductor substrate;
  forming an interlevel dielectric (ILD) layer on the semiconductor substrate;

forming a first stud hole in the ILD layer on a first side of the gate electrode, the first stud hole having a width at an entrance part adjacent to the surface of the ILD layer larger than a width at a contacting part adjacent to the semiconductor substrate;

forming a second stud hole in the ILD layer on a second side of the gate electrode that is opposite the first side of the gate electrode, the second stud hole spaced apart from the first stud hole in the ILD layer, the width at the entrance part of the first stud hole on the first side of the gate electrode being larger than a width at an entrance part of the second stud hole at the second side of the gate electrode;

forming first and second contact studs on the first and second sides of the gate electrode, respectively, by filling the first stud hole and the second stud hole with a conductive material, wherein forming the first stud hole and forming the second stud hole comprises:

forming a plurality of first holes by etching a portion of the ILD layer to a shallower depth than that of the ILD layer; and forming a plurality of second holes for etching part of the ILD layer positioned under the first hole selected from the plurality of first holes and a portion of the ILD layer on which the plurality of first holes are not formed and exposing the semiconductor substrate;

forming a conductive landing pad having a lower surface of a width larger than a width of a top of the second contact stud that is in direct physical contact with the ILD layer, and that is in contact with the second contact stud.

2. The method of claim 1, wherein the step of forming a second contact stud comprises:

forming a photoresist pattern on the ILD layer on which the plurality of first holes are formed, while covering internal sidewalls of the selected first hole, which exposes other portions of the ILD layer; and etching the ILD layer to have the shape of the photoresist pattern.

3. The method of claim 1, before the step of forming the ILD layer on the semiconductor, further comprising:

forming gate electrodes on the semiconductor substrate;

forming junction regions at the semiconductor substrate between the gate electrodes; and forming self-aligned contact plugs in locations between the gate electrodes.

4. The method of claim 3, wherein the first holes are formed to a depth equal to or greater than the distance from the surface of the ILD layer to the surface of the contact plugs.

5. The method of claim 1, after the step of forming a conductive landing pad, further comprising the step of forming an etch stopper to cover the conductive landing pad.

6. The method of claim 5, wherein the step of forming an etch stopper comprises:

forming a first etch stopper on the conductive landing pad; and forming a second etch stopper formed of a spacer on sidewalls of the landing pad and the first etch stopper.

7. The method of claim 1, wherein the first and second contact studs contact first and second junction regions adjacent to the gate electrode.

8. A method for manufacturing a semiconductor device, the method comprising:

forming a gate electrode on a semiconductor substrate;

forming an interlevel dielectric (ILD) layer on the semiconductor substrate;

forming a first stud hole in the ILD layer on a first side of the gate electrode, the first stud hole having a width at an entrance part adjacent to the surface of the ILD layer larger than a width at a contacting part adjacent to the semiconductor substrate;

forming a second stud hole in the ILD layer on a second side of the gate electrode that is opposite the first side of the gate electrode, the second stud hole spaced apart from the first stud hole in the ILD layer, the width at the entrance part of the first stud hole on the first side of the gate electrode being larger than a width at an entrance part of the second stud hole at the second side of the gate electrode;

forming first and second contact studs on the first and second sides of the gate electrode, respectively, by filling the first stud hole and the second stud hole with a conductive material, wherein forming a first stud hole and the second stud hole comprise:

forming a plurality of first holes by etching a portion of the ILD layer to a shallower depth than that of the ILD layer; and forming a plurality of second holes for etching part of the ILD layer positioned under the first hole selected from the plurality of first holes and a portion of the ILD layer on which the plurality of first holes are not formed and exposing the semiconductor substrate; and forming a conductive landing pad having a width larger than a width of a top of the second contact stud, on the ILD layer, in contact with the second contact stud.

9. The method of claim 8, wherein forming a second contact stud comprises:

forming a photoresist pattern on the ILD layer on which the plurality of first holes are formed, while covering internal sidewalls of the selected first hole, which exposes other portions of the ILD layer; and etching the ILD layer to have the shape of the photoresist pattern.

10. The method of claim 8, before forming the ILD layer on the semiconductor, further comprising:

forming gate electrodes on the semiconductor substrate;

forming junction regions at the semiconductor substrate between the gate electrodes; and forming self-aligned contact plugs in locations between the gate electrodes.

11. The method of claim 10, wherein the first holes are formed to a depth equal to or greater than the distance from the surface of the ILD layer to the surface of the contact plugs.

* * * * *